United States Patent
Darden et al.

(10) Patent No.: US 9,053,285 B2
(45) Date of Patent: Jun. 9, 2015

(54) THERMALLY AWARE PIN ASSIGNMENT AND DEVICE PLACEMENT

(71) Applicant: International Business Machines Corporation, Armonk, NY (US)

(72) Inventors: Randall J. Darden, Essex Junction, VT (US); Shyam Ramji, Lagrangeville, NY (US); Sourav Saha, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/056,007

(22) Filed: Oct. 17, 2013

(65) Prior Publication Data

US 2015/0113496 A1    Apr. 23, 2015

(51) Int. Cl.
G06F 17/50    (2006.01)
G06F 9/455    (2006.01)

(52) U.S. Cl.
CPC .................................. G06F 17/5081 (2013.01)

(58) Field of Classification Search
CPC ............ G06F 17/5036; G06F 17/5072; G06F 17/5068; G06F 17/5077; G06F 17/505; G06F 17/5031; G06F 17/5054; G06F 17/5045
USPC .................................. 716/123, 126, 132, 134
See application file for complete search history.

(56) References Cited

U.S. PATENT DOCUMENTS

| | | | |
|---|---|---|---|
| 7,401,304 B2 | 7/2008 | Li et al. | |
| 7,627,841 B2 | 12/2009 | Shakouri et al. | |
| 8,185,862 B2 | 5/2012 | Durbha et al. | |
| 8,235,593 B2 | 8/2012 | Sri-Jayantha et al. | |
| 8,572,535 B2 * | 10/2013 | Rahmat et al. | 716/113 |
| 2006/0095913 A1 | 5/2006 | Bodas et al. | |
| 2008/0168406 A1 * | 7/2008 | Rahmat et al. | 716/2 |
| 2009/0106714 A1 * | 4/2009 | Culp et al. | 716/5 |
| 2009/0319964 A1 * | 12/2009 | Kariat et al. | 716/4 |
| 2009/0319965 A1 * | 12/2009 | Kariat et al. | 716/4 |
| 2010/0023903 A1 * | 1/2010 | Pramono et al. | 716/5 |
| 2013/0086545 A1 | 4/2013 | Alpert et al. | |

OTHER PUBLICATIONS

Cheng, Y. & Kang, S. (1999). An efficient method for hot-spot identification in ULSI circuits. ICCAD '99 Proceedings of the 1999 IEEE/ACM international conference on Computer-aided Design. 124-127.

Zanini, F., Atienza, D. & Giovanni, D. (Jan. 2009). A control theory approach for thermal balancing of MPSoC. Design Automation Conference, Asia and South Pacific. 37-42. Doi: 10.1109/ASPDAC. 2009.4796438. See pp. 37 & 42.

* cited by examiner

*Primary Examiner* — Vuthe Siek
*Assistant Examiner* — Magid Dimyan
(74) *Attorney, Agent, or Firm* — Cantor Colburn LLP; Margaret McNamara

(57) ABSTRACT

Embodiments of the disclosure relate to methods for facilitating the design of an integrated circuit (IC) using thermally aware pin assignment and device placement. The method includes creating a layout for the IC, the layout including a plurality of macros each having devices and pin assignments and revising the layout for the IC by repositioning a macro or a device to meet a timing requirement of the IC. The method also includes creating a thermal map of the IC based on the layout for the IC and a workload model for the IC and identifying at least one thermally critical pin assignment based on the thermal map of the IC. The method includes revising the layout by repositioning a thermally critical pin assignment and a device.

18 Claims, 5 Drawing Sheets

THERMALLY AWARE PIN ASSIGNMENT AND DEVICE PLACEMENT

BACKGROUND

The present disclosure relates to the design of integrated circuits, and more specifically, to methods and computer program products for facilitating the design of integrated circuits using thermally aware pin assignment and device placement.

When an integrated circuit, or chip, is operating, the temperature can vary throughout the chip due to the power consumption and dissipation in the CMOS-transistors. In general, the power consumption is caused by transistor switching, short-circuit and leakage power consumption. The average switching power dissipation is due to the required energy to charge up the parasitic and load capacitances of a transistor. In most cases, the largest contribution to the power consumption is the transistor switching. The dissipated power will increase the temperature of the surrounding area of the integrated circuit. Temperature variation in a chip affects the performance of the integrated circuit. In general, the propagation delay across the chip increases with increased temperature.

In current integrated circuit designs, hot-spots in the integrated circuit are often formed because of a clustering of high-activity interconnects (and connected devices) in certain areas of a chip. As a result of this hot-spot formation, non-desired impacts will be seen on chip operation. There will be reliability concerns in the hot-spots as well as additional leakage power dissipation (leakage power approximately doubles with every 10 degree Celsius rise in temperature).

SUMMARY

According to one embodiment, a method for facilitating the design of an integrated circuit using thermally aware pin assignment and device placement. The method includes creating, with a processing device, a layout for the integrated circuit, the layout including a plurality of macros each having one or more devices and one or more pin assignments and revising the layout for the integrated circuit by repositioning one or more of the plurality of macros and the one or more devices to meet a timing requirement of the integrated circuit. The method also includes creating a thermal map of the integrated circuit based on the layout for the integrated circuit and a workload model for the integrated circuit and identifying at least one thermally critical pin assignment from the one or more pin assignments based on the thermal map of the integrated circuit. The method also includes revising the layout by repositioning at least one of the at least one thermally critical pin assignment and the one or more devices. Based on determining that the layout meets the timing requirements of the integrated circuit, the method includes outputting the layout of the integrated circuit. Based on determining that the layout does not meet the timing requirements of the integrated circuit, the method includes iteratively repeating the repositioning of the one or more of the macros, creating the thermal map, identifying the least one thermally critical pin assignment, and revising the layout by repositioning at least one of the at least one thermally critical pin assignment and the one or more devices.

According to another embodiment, a computer program product for facilitating the design of an integrated circuit using thermally aware pin assignment and device placement, the computer program product including a tangible storage medium readable by a processing circuit and storing instructions for execution by the processing circuit for performing a method that includes creating a layout for the integrated circuit, the layout including a plurality of macros each having one or more devices and one or more pin assignments and revising the layout for the integrated circuit by repositioning one or more of the plurality of macros and the one or more devices to meet a timing requirement of the integrated circuit. The method also includes creating a thermal map of the integrated circuit based on the layout for the integrated circuit and a workload model for the integrated circuit and identifying at least one thermally critical pin assignment from the one or more pin assignments based on the thermal map of the integrated circuit. The method also includes revising the layout by repositioning at least one of the at least one thermally critical pin assignment and the one or more devices. Based on determining that the layout meets the timing requirements of the integrated circuit, the method includes outputting the layout of the integrated circuit. Based on determining that the layout does not meet the timing requirements of the integrated circuit, the method includes iteratively repeating the repositioning of the one or more of the macros, creating the thermal map, identifying the least one thermally critical pin assignment, and revising the layout by repositioning at least one of the at least one thermally critical pin assignment and the one or more devices.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In accordance with exemplary embodiments of the disclosure, a method for facilitating the design of integrated circuits using thermally aware pin assignment and device placement is provided. In exemplary embodiments, a thermal map is computed for a workload model, a given device placement and associated pin assignments. Peak hot-spot zones and associated pin assignment clustering are computed from the thermal map and pins which are densely clustered in a hot-spot grid and associated with high activity factor are spread into adjacent grids. In exemplary embodiments, the movement of pins includes considering thermal, timing and congestion effects simultaneously using a weighted cost function approach.

Figure 1:
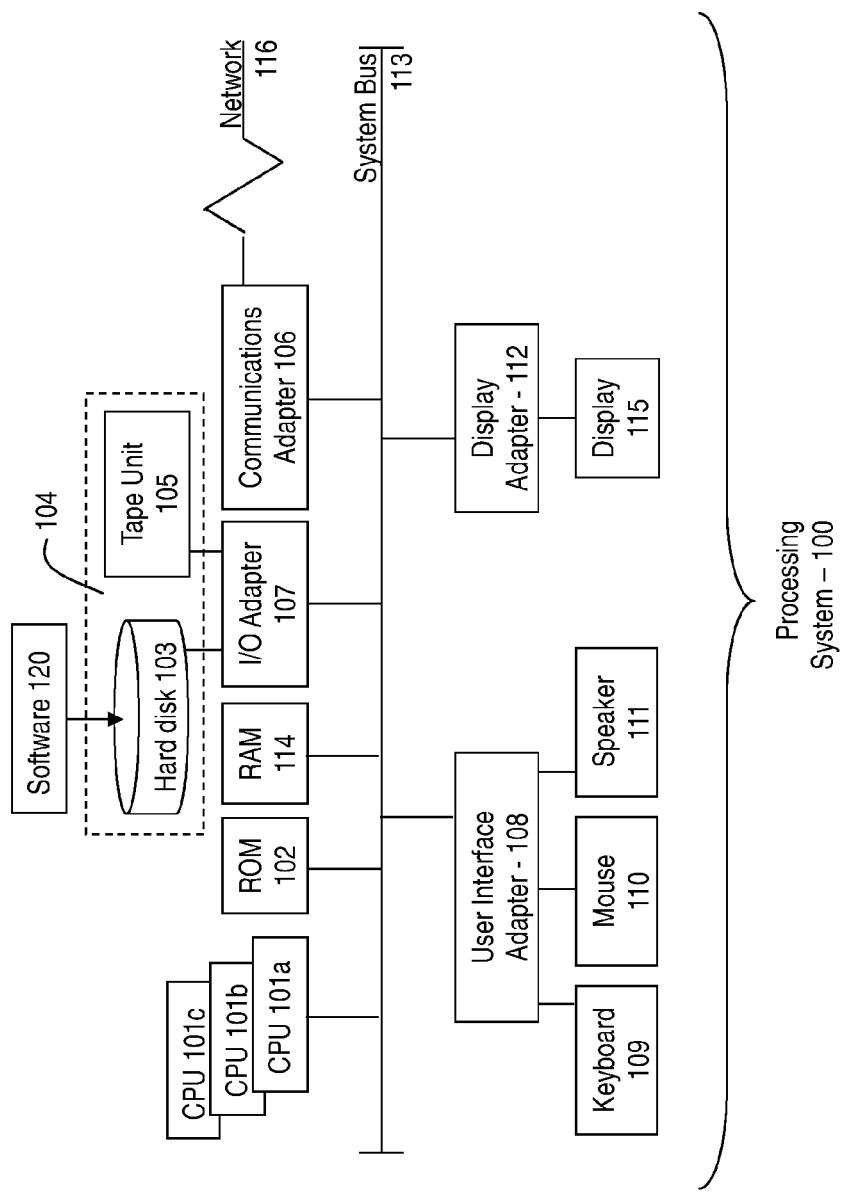
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Software 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system such as the AIX® operating system from IBM Corporation to coordinate the functions of the various components shown in FIG. 1.

Figure 2:
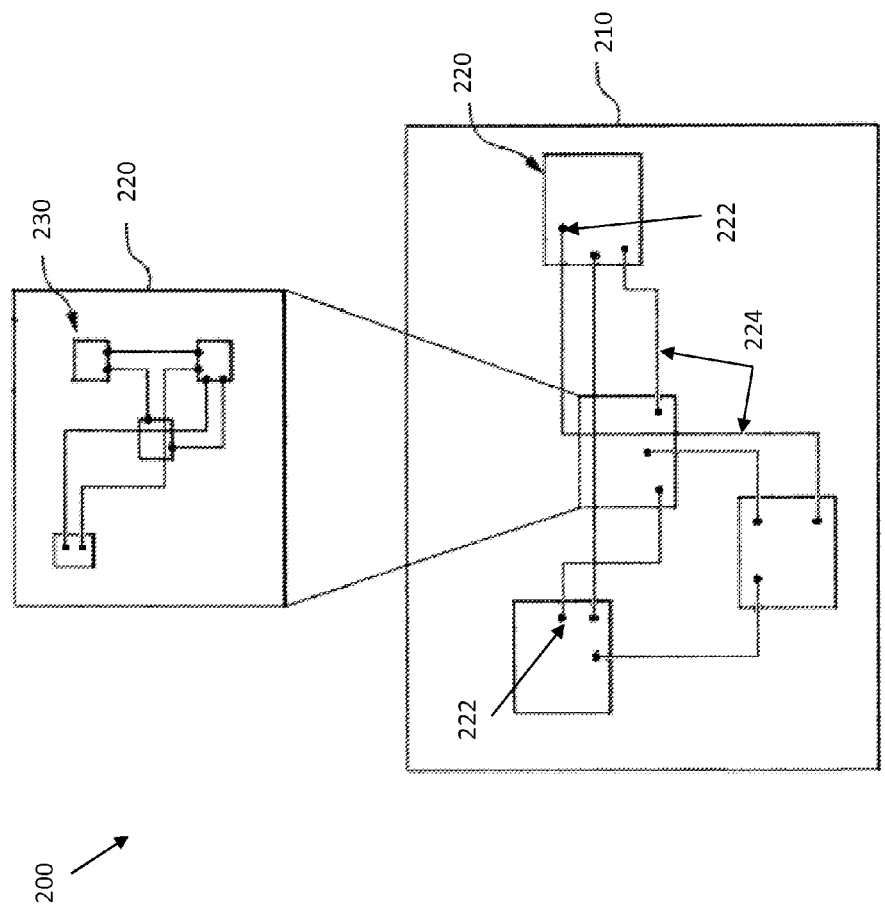
FIG. 2 illustrates a schematic layout of a integrated circuit in accordance with an exemplary embodiment.

Referring now to FIG. 2, a layout of an integrated circuit 200 in accordance with an exemplary embodiment is shown. As illustrated, the integrated circuit 200 includes a chip 210 that has been partitioned into logical partitions referred to as macros 220 with each unit sized and assigned a non-overlapping region of the chip 210. Each macro 220, in turn can be further partitioned into smaller elements, referred to as devices 230, and each of the devices 230 can be further partitioned into smaller elements until there is a physical hierarchy of "n" levels, where "n" can be any integer but is typically limited to the number of levels required reach a manageable size design entity. Furthermore, each partition, including macro 220 and device 230, has a physical representation, which is referred to as an abstract. In exemplary embodiments, the abstract is an abstraction which contains a rectilinear polygon representing the physical size of the partition. Each macro 220 includes pins 222 representing the physical connections to/from the macro 220. The wiring between macros 220 is referred to as interconnects 224 and the intra-partition wiring is referred to as local wiring (not shown). As illustrated, the pins 222 may be located on the edge of or inside of the macros 220. In exemplary embodiments, the location of the pins 222 may be internal to the macros 220 to meet the timing requirements for the chip 210.

Figure 3:
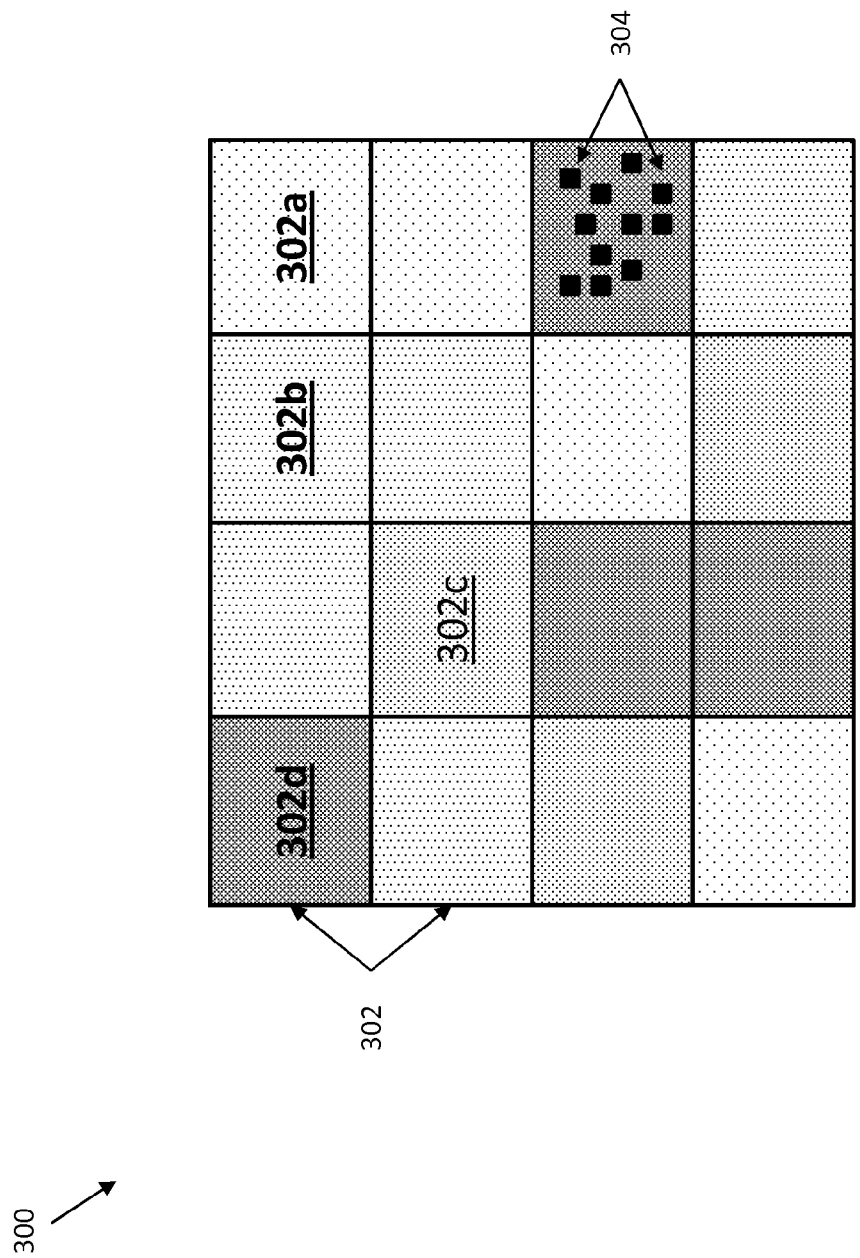
FIG. 3 illustrates a block diagram of thermal map of a integrated circuit in accordance with an exemplary embodiment.

Referring now to FIG. 3, a thermal map 300 of an integrated circuit is shown. In exemplary embodiments, the thermal map 300 is broken into a plurality of cells 302 that each represents a physical portion of the chip. In exemplary embodiments, each chip may include one or more entire macro, or portions of one or macros, as shown in FIG. 2. In exemplary embodiments, the thermal map 300 may be created based on boundary switching activity assumptions for an individual or workload model combination and propagating switching factors through the connected devices using existing methods like Binary Decision Diagrams (BDD) or equivalents.

The cells 302 of the thermal map 300 are color coded based on the expected thermal characteristics of each area of the integrated circuit. For example, cells 302a are expected to have the lowest relative temperature of the cells 302, cells 302b are expected to have a higher temperature than cells 302a, cells 302c are expected to have a higher temperature than cells 302b, and cells 302d are expected to have the highest relative temperature of the cells 302. Each cell 302 may include one or more pins 304 that are located within the portion of the integrated circuit corresponding to the cell 302. As illustrated, a large cluster of pins 304 may be located in a thermal hot-spot area of the integrated circuit, such as cell 302d, that is has a high activity factor. Accordingly, it is desirable to move one or more of the pins 304 to adjacent cells 302.

Figure 4:
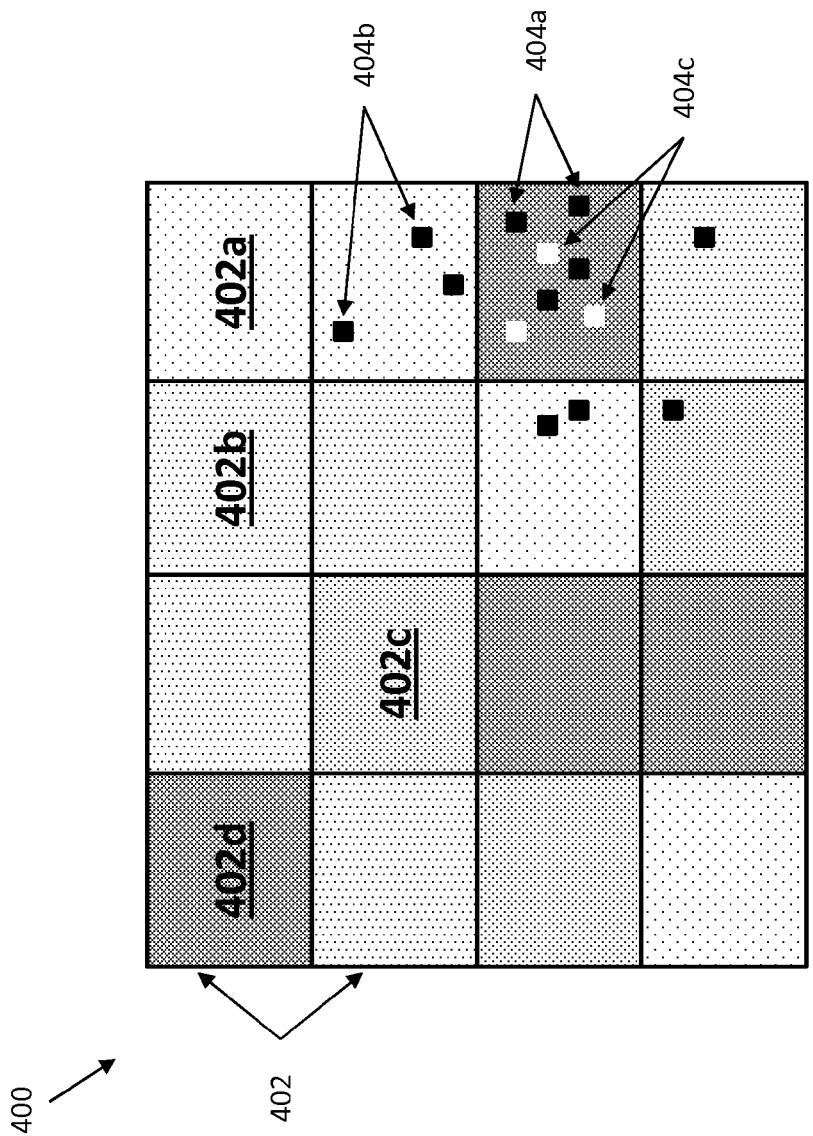
FIG. 4 illustrates a block diagram of thermal map of a integrated circuit in accordance with an exemplary embodiment.

Referring now to FIG. 4, a thermal map 400 of an integrated circuit is shown. In exemplary embodiments, the thermal map 400 is broken into a plurality of cells 402 that each represents a physical portion of the integrated circuit. In exemplary embodiments, each chip may include one or more entire macro, or portions of one or macros, as shown in FIG. 2. The cells 402 of the thermal map 400 are color coded based on the expected thermal characteristics of each area of the integrated circuit. For example, cells 402a are expected to have the lowest relative temperature of the cells 402, cells 402b are expected to have a higher temperature than cells 402a, cells 402c are expected to have a higher temperature than cells 402b, and cells 402d are expected to have the highest relative temperature of the cells 402. In exemplary embodiments, one or more thermally critical pins 404b are identified based on the thermal map of the integrated circuit.

In exemplary embodiments, pins 404 are redistributed across cells 402 based on a weighted cost-function which accounts for timing and thermal effects. In exemplary embodiments, the weighted cost-function may account for other parameters such as congestion, cross-talk, etc. In exemplary embodiments, the redistribution of the pins 404 may include moving one or more pins 404 either into or out of identified hot-spots. For example, pins 404b are thermally critical pins 404 that have been moved from a hot-spot, such as cell 402d, to a neighboring cell 402 that has a lower temperature. In exemplary embodiments, thermally critical pins are pins that are located in a hot-spot that have a high activity factor for the modeled workload. Pins 404c are non-thermally critical pins 404 that have been moved from neighboring cell 402 into a hot-spot, such as cell 402d. In exemplary embodiments, non-thermally critical pins 404c are pins 404 that are located near a hot-spot that have a low activity factor for the modeled workload. Pins 404a are pins 404 that are not moved during the redistribution process.

In exemplary embodiments, the weighted cost-function which accounts for thermal effects may only be applied for modifying pin assignments for pins that fall within cells 402d identified as hot-spots. In exemplary embodiments, for pins 404 not located in cells 402d identified as hot-spots, traditional pin assignment algorithms can be used.

Figure 5:
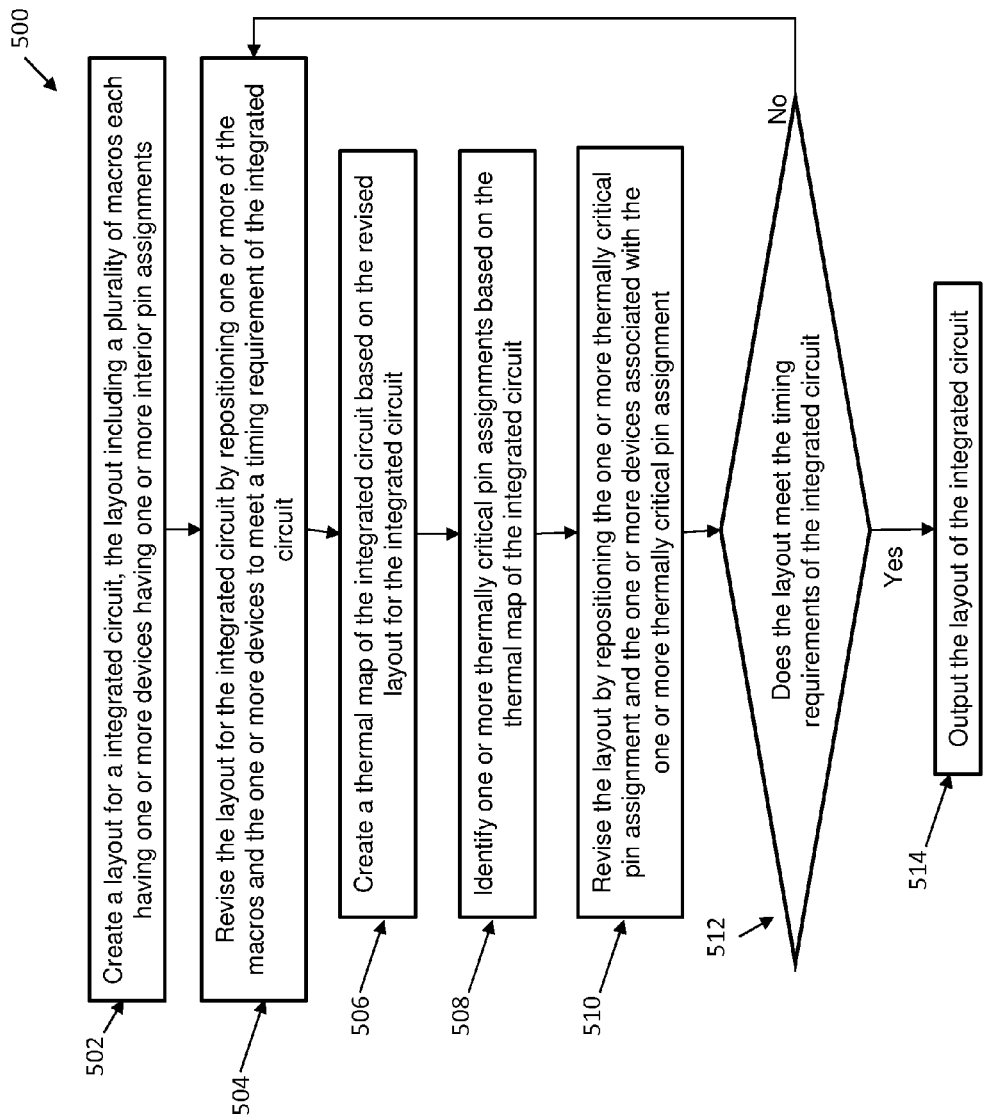
FIG. 5 illustrates a flow diagram of a method for facilitating the design of integrated circuits using thermally aware pin assignment and device placement in accordance with an exemplary embodiment.

Referring now to FIG. 5, a flow diagram of a method 500 for facilitating the design of integrated circuits using thermally aware pin assignment and device placement in accordance with an exemplary embodiment is shown. As shown at block 502, the method 500 includes creating a layout for an integrated circuit, the layout including a plurality of macros each having one or more devices and one or more pin assignments. Next, the method 500 includes revising the layout for the integrated circuit by repositioning one or more of the plurality of macros and the one or more devices to meet a timing requirement of the integrated circuit, as shown at block 504. As shown at block 506, the method 500 includes creating a thermal map of the integrated circuit based on the revised layout for the integrated circuit.

Continuing with reference to FIG. 5, the method 500 includes identifying one or more thermally critical pin assignments based on the thermal map of the integrated circuit, as shown at block 508. As shown at block 510, the method 500 includes revising the layout by repositioning the one or more thermally critical pin assignments. Next, as shown at decision block 512, the method 500 includes determining if the layout meets the timing requirements of the integrated circuit. If the layout meets the timing requirements of the integrated circuit the method 500 proceeds to block 514 and outputs the layout of the integrated circuit. Otherwise, the method returns to block 504 and iteratively repeats the repositioning of the one or more of the macros and the thermally critical pin assignments.

In exemplary embodiments, pins are modeled as thermal excitation source and sink locations across different hierarchies within a chip. Having a thermal map based pin optimization mechanism creates a coherent framework across the micro-architecture, floor-planning, physical design closure process towards thermal optimization goals.

In exemplary embodiments, device placement and hence integrated circuit layout gets re-distributed based on new pin positions computed based on thermal considerations. Pins serve as anchor points for device placement determination for a set of connected devices. In exemplary embodiments, positioning of thermally critical devices and interconnects are optimized by re-distributing thermally critical pins and interleaving them with thermally non-critical pins. As a result, thermal hot-spots are diffused over a bigger area and hot-spot intensity comes down, as shown in FIG. 4.

In exemplary embodiments, thermally critical pins are determined based on actual switching activity involved, numbers of devices under influence of the pins based on fan-in and fan-out counts and also relative positioning of one thermally critical pin with reference to other. Relative contribution of a thermally critical pin to hotspot formation increases significantly if other thermally critical pins are also located nearby. In exemplary embodiments, thermally aware pin optimization includes techniques like pin repulsion where a minimum threshold separation is computed between two thermally critical pins, artificially increasing minimum separation of two critical pins keeping regular pin separation criteria for other pins, ensuring a percentage distribution of thermally critical and thermally non-critical pins in hot-spot zones among others.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for facilitating the design of an integrated circuit using thermally aware pin assignment and device placement, the method comprising:
    creating, with a processing device, a layout for the integrated circuit, the layout including a plurality of macros each having one or more devices having one or more pin assignments, wherein the layout is designed to meet a timing requirement of the integrated circuit;
    creating a thermal map of the integrated circuit based on the layout for the integrated circuit and a workload model for the integrated circuit;
    identifying at least one thermally critical pin assignment from the one or more pin assignments based on the thermal map of the integrated circuit; and
    revising the layout by repositioning the at least one thermally critical pin assignment; and
    based on determining that the layout meets the timing requirement of the integrated circuit, outputting the layout of the integrated circuit.

2. The method of claim 1, further comprising:
    based on determining that the layout does not meet the timing requirement of the integrated circuit, iteratively repeating the repositioning of the one or more of the macros, creating the thermal map, identifying the least one thermally critical pin assignment, and revising the layout by repositioning the at least one thermally critical pin assignment and by repositioning the one or more devices associated with the at least one thermally critical pin assignment.

3. The method of claim 1, wherein the thermal map includes at least one area of the integrated circuit identified as a hot-spot.

4. The method of claim 3, wherein the at least one thermally critical pin assignment is located in the hot-spot.

5. The method of claim 4, wherein revising the layout by repositioning the at least one thermally critical pin assignment includes moving the at least one thermally critical pin assignment to a location of the integrated circuit that is not the hot-spot.

6. The method of claim 4, wherein the at least one thermally critical pin assignment is associated with a high activity factor of the workload model for the integrated circuit.

7. The method of claim 1, further comprising:
identifying at least one non-thermally critical pin assignment from the one or more pin assignments based on the thermal map of the integrated circuit; and
revising the layout by repositioning the at least one non-thermally critical pin assignment.

8. The method of claim 7, wherein the thermal map includes at least one area of the integrated circuit identified as a hot-spot.

9. The method of claim 8, wherein the at least one non-thermally critical pin assignment is not located in the hot-spot.

10. The method of claim 8, wherein revising the layout by repositioning the at least one non-thermally critical pin assignment includes moving the at least one non-thermally critical pin assignment to a location of the integrated circuit that is in the hot-spot.

11. The method of claim 9, wherein the at least one non-thermally critical pin assignment is associated with a low activity factor of the workload model for the integrated circuit.

12. A computer program product for facilitating the design of an integrated circuit using thermally aware pin assignment and device placement, the computer program product comprising:
a tangible storage medium readable by a processing circuit and storing instructions for execution by the processing circuit for performing a method comprising:
creating, with a processing device, a layout for the integrated circuit, the layout including a plurality of macros each having one or more devices having one or more pin assignments, wherein the layout is designed to meet a timing requirement of the integrated circuit;
creating a thermal map of the integrated circuit based on the layout for the integrated circuit and a workload model for the integrated circuit;
identifying at least one thermally critical pin assignment from the one or more pin assignments based on the thermal map of the integrated circuit; and
revising the layout by repositioning the at least one thermally critical pin assignment; and
based on determining that the layout meets the timing requirement of the integrated circuit, outputting the layout of the integrated circuit.

13. The computer program product of claim 12, further comprising:
based on determining that the layout does not meet the timing requirement of the integrated circuit, iteratively repeating the repositioning of the one or more of the macros, creating the thermal map, identifying the least one thermally critical pin assignment, and revising the layout by repositioning the at least one thermally critical pin assignment and by repositioning the one or more devices associated with the at least one thermally critical pin assignment.

14. The computer program product of claim 12, wherein the thermal map includes at least one area of the integrated circuit identified as a hot-spot.

15. The computer program product of claim 14, wherein the at least one thermally critical pin assignment is located in the hot-spot.

16. The computer program product of claim 15, wherein revising the layout by repositioning the at least one thermally critical pin assignment includes moving the at least one thermally critical pin assignment to a location of the integrated circuit that is not the hot-spot.

17. The computer program product of claim 15, wherein the at least one thermally critical pin assignment is associated with a high activity factor of the workload model for the integrated circuit.

18. The computer program product of claim 12, further comprising:
identifying at least one non-thermally critical pin assignment from the one or more pin assignments based on the thermal map of the integrated circuit; and
revising the layout by repositioning the at least one non-thermally critical pin assignment.

* * * * *